United States Patent
Fan

(10) Patent No.: US 12,154,612 B2
(45) Date of Patent: Nov. 26, 2024

(54) CONTROL CIRCUIT AND SEMICONDUCTOR MEMORY

(71) Applicant: CHANGXIN MEMORY TECHNOLOGIES, INC., Hefei (CN)

(72) Inventor: Yupeng Fan, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 230 days.

(21) Appl. No.: 17/854,146

(22) Filed: Jun. 30, 2022

(65) Prior Publication Data

US 2023/0307032 A1    Sep. 28, 2023

Related U.S. Application Data

(63) Continuation of application No. PCT/CN2022/087730, filed on Apr. 19, 2022.

(30) Foreign Application Priority Data

Mar. 25, 2022  (CN) .......................... 202210307197.8

(51) Int. Cl.
*G11C 11/40*      (2006.01)
*G11C 11/407*     (2006.01)
*H03K 19/20*      (2006.01)

(52) U.S. Cl.
CPC ............ *G11C 11/407* (2013.01); *H03K 19/20* (2013.01)

(58) Field of Classification Search
CPC .............. G11C 11/407; G11C 11/4072; G11C 11/4074; H03K 19/20
See application file for complete search history.

(56) References Cited

U.S. PATENT DOCUMENTS

| | | | |
|---|---|---|---|
| 6,239,649 | B1 | 5/2001 | Bertin |
| 6,294,404 | B1 | 9/2001 | Sato |
| 2001/0046156 | A1* | 11/2001 | Miyazaki ............... G11C 5/143 |
| | | | 365/156 |
| 2003/0080802 | A1* | 5/2003 | Ono ................. H03K 19/00384 |
| | | | 327/534 |
| 2005/0047247 | A1 | 3/2005 | Hatakeyama |
| 2006/0023520 | A1 | 2/2006 | Mori et al. |

(Continued)

FOREIGN PATENT DOCUMENTS

| | | |
|---|---|---|
| CN | 1585271 A | 2/2005 |
| CN | 1741190 A | 3/2006 |

(Continued)

*Primary Examiner* — Uyen Smet

(74) *Attorney, Agent, or Firm* — Kilpatrick Townsend & Stockton LLP

(57) ABSTRACT

Embodiments provide a control circuit and a semiconductor memory. The control circuit includes a bias switching circuit and a first logic gate circuit. The first logic gate circuit includes at least one target transistor. A substrate of one of the at least one target transistor is connected to an output terminal of the bias switching circuit. The first logic gate circuit has a first speed mode and a second speed mode. A transmission speed of the first speed mode is less than a transmission speed of the second speed mode. The bias switching circuit is configured to: receive a target signal, and output a target bias voltage, to increase a threshold voltage of the target threshold. The enabled state of the target signal represents that the first logic gate circuit is in the first speed mode.

18 Claims, 13 Drawing Sheets

(56) References Cited

U.S. PATENT DOCUMENTS

| | | |
|---|---|---|
| 2007/0024344 A1 | 2/2007 | Hatakeyama |
| 2009/0147594 A1 | 6/2009 | Chou |
| 2010/0134182 A1 | 6/2010 | Kapoor |
| 2019/0035434 A1 | 1/2019 | Tanaka et al. |
| 2019/0065106 A1 | 2/2019 | Howe |
| 2019/0180794 A1 | 6/2019 | Tanaka et al. |
| 2019/0287576 A1 | 9/2019 | Tanaka et al. |
| 2020/0081476 A1* | 3/2020 | Lallement .......... H03K 19/0013 |
| 2021/0394339 A1 | 12/2021 | Howe |

FOREIGN PATENT DOCUMENTS

| | | |
|---|---|---|
| CN | 101443916 A | 5/2009 |
| CN | 110868201 A | 3/2020 |
| CN | 110890886 A | 3/2020 |
| CN | 111416613 A | 7/2020 |
| CN | 113364442 A | 9/2021 |

* cited by examiner

CONTROL CIRCUIT AND SEMICONDUCTOR MEMORY

CROSS-REFERENCE TO RELATED APPLICATIONS

This application is a continuation of International Application No. PCT/CN2022/087730, filed on Apr. 19, 2022, which is based on and claims priority to Chinese patent application No. 202210307197.8, entitled "CONTROL CIRCUIT AND SEMICONDUCTOR MEMORY" and filed on Mar. 25, 2022. The contents of International Application No. PCT/CN2022/087730 and Chinese patent application No. 202210307197.8 are hereby incorporated by reference in their entireties.

BACKGROUND

With continuous development of semiconductor technologies, people are manufacturing and using computers and other devices with increasing demands on the speed of data transmission. To obtain a faster data transmission speed, a series of memories and other devices that can transmit data at a Double Data Rate (DDR) have emerged.

In a Dynamic Random Access Memory (DRAM), at present the main focus is leakage currents such as a source/substrate leakage current, a drain/substrate leakage current, a source/drain leakage current, and a gate/substrate leakage current of a logic gate circuit. However, in response to that a substrate voltage is the same as a source voltage, a transistor has a relatively low threshold voltage, a high saturation current, and a fast speed. In this case, there is a high leakage current between a source and a drain, resulting in high power consumption.

SUMMARY

The disclosure relates to the field of semiconductor technologies, and in particular to a control circuit and a semiconductor memory.

According to a first aspect, embodiments of the disclosure provide a control circuit including a first logic gate circuit and a bias switching circuit. The first logic gate circuit includes at least one target transistor, a substrate of one of the at least one target transistor is connected to an output terminal of the bias switching circuit, the first logic gate circuit has a first speed mode and a second speed mode, and a transmission speed of the first speed mode is lower than a transmission speed of the second speed mode. The bias switching circuit is configured to: receive a target signal, and in response to that the target signal is in an enabled state, output a target bias voltage to increase a threshold voltage of the target transistor, wherein the enabled state of the target signal represents that the first logic gate circuit is in the first speed mode.

According to a second aspect, the embodiments of the disclosure provide a semiconductor memory, including a control circuit. The first logic gate circuit includes at least one target transistor, a substrate of one of the at least one target transistor is connected to an output terminal of the bias switching circuit, the first logic gate circuit has a first speed mode and a second speed mode, and a transmission speed of the first speed mode is lower than a transmission speed of the second speed mode. The bias switching circuit is configured to: receive a target signal, and in response to that the target signal is in an enabled state, output a target bias voltage to increase a threshold voltage of the target transistor, wherein the enabled state of the target signal represents that the first logic gate circuit is in the first speed mode.

DETAILED DESCRIPTION

Figure 1:
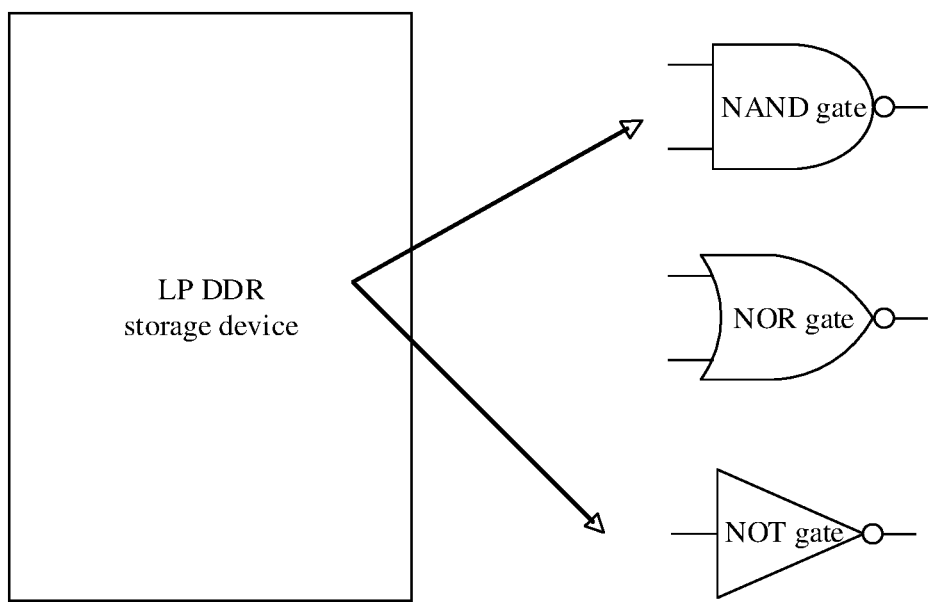
FIG. 1 illustrates a schematic structural diagram of a low-power double data rate (LPDDR) storage device.

The following clearly and completely describes the technical solutions in the embodiments of the disclosure with reference to the accompanying drawings in the embodiments of the disclosure. It may be understood that the specific embodiments described herein are only used to explain the related disclosure rather than limiting. In addition, it further needs to be noted that only parts related to the disclosure are shown in the accompanying drawings for ease of description.

Unless otherwise defined, the technical terms and scientific terms used herein have the same meanings as how they are generally understood by a person skilled in the art to which the disclosure pertains. The terms used herein in are merely used for describing the embodiments of the disclosure, but are not intended to limit the disclosure.

In the following description, reference is made to "some embodiments", which describes a subset of all possible embodiments, but it may be understood that "some embodiments" may be the same subset or a different subset of all possible embodiments, and may be combined with each other without conflict.

It needs to noted that references to the terms "first, second, and third" in the embodiments of the disclosure are only to distinguish similar objects and do not denote a specific order of objects. It is understandable that the terms "first, second, and third" are interchangeable in specific orders or sequences, where appropriate, to enable embodiments of the disclosure described herein to be practiced in an order other than the order shown or described herein.

It should further be noted that a high level and a low level used for signals in the embodiments of the disclosure are logic levels of the signals. There are differences between a case when a signal has a high level and a case when the signal has a low level. For example, a high level may correspond to a signal with a first voltage, and a low level may correspond to a signal with a second voltage. In some embodiments, the first voltage is greater than the second voltage. In addition, the logic level of a signal may be different from or opposite to a described logic level. For example, a signal described with a logic "high" level may alternatively have a logic "low" level, whereas a signal described with a logic "low" level may alternatively have a logic "high" level.

For a semiconductor memory, a control circuit may be used to apply a power supply voltage to respective logic circuits for configuring the semiconductor memory, to allow the semiconductor memory to perform various operations. According to an operating frequency of the semiconductor memory, the semiconductor memory may selectively use at least one of a high power supply voltage or a low power supply voltage. This manner of selectively using an appropriate one of two or more power supply voltages according to the operating frequency of the semiconductor memory is generally referred to as a Dynamic Voltage Frequency Scaling Core (DVFSC) mode.

Specifically, the semiconductor memory may perform the DVFSC mode, and determine a first speed mode and a second speed mode based on a transmission speed of the semiconductor memory. For example, the first speed mode may be a mode in which the semiconductor memory and a low-frequency clock signal synchronously operate at a relatively low transmission speed. The second speed mode may be a mode in which the semiconductor memory and a high-frequency clock signal synchronously operate at a relatively high transmission speed. It is assumed that the semiconductor memory may operate with a first power supply voltage and a second power supply voltage that are provided. In this case, one of the first power supply voltage and the second power supply voltage is selected and used according to the transmission speed of the semiconductor memory. For example, the first power supply voltage with a relatively high level may be supplied to the semiconductor memory for the semiconductor memory to operate at a relatively low transmission speed in the first speed mode. The second power supply voltage with a relatively low level may be supplied to the semiconductor memory for the semiconductor memory to operate at a relatively high transmission speed in the second speed mode.

It may be understood that as illustrated in FIG. 1, a low power (LP) Double Data Rate (DDR) storage device may include thousands of logic gate devices such as NOT gates, NOR gates, and NAND gates. These logic devices form different logic gate circuits, and are applied with power supply voltages to perform various operations.

Figure 2:
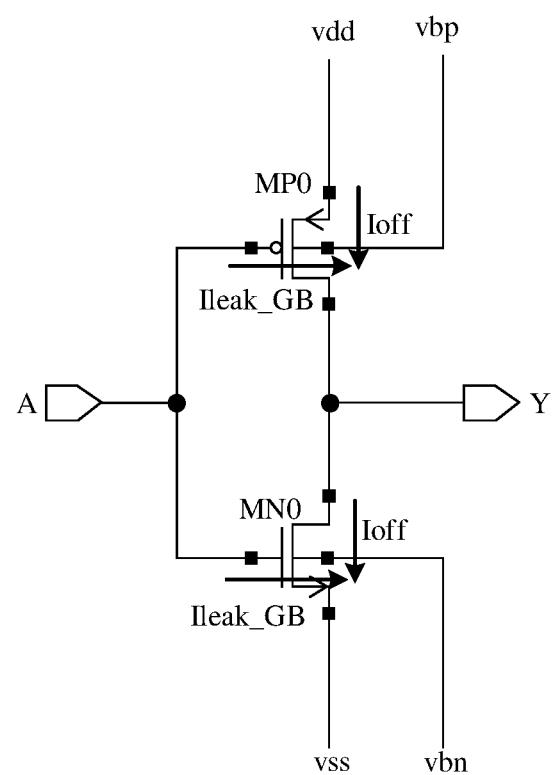
FIG. 2 illustrates a schematic structural diagram of a NOT gate device.

A NOT gate device is taken as an example. Referring to FIG. 2, a NOT gate may be formed by two types of transistors. One type of transistor is a P-type Metal-Oxide-Semiconductor Field-Effect Transistor (MOSFET), referred to as a PMOS transistor for short. The other type of transistor is an N-type Metal-Oxide-Semiconductor Field-Effect Transistor (MOSFET), referred to as an NMOS transistor for short. In addition, the PMOS transistor has an N-type substrate, and the NMOS transistor has a P-type substrate. Details are illustrated in FIG. 2. MP0 is a PMOS transistor, and MN0 is an NMOS transistor. A source terminal of MP0 is connected to a signal vdd, and a back gate terminal of MP0 is connected to a signal vbp. A source terminal of MN0 is connected to a signal vss, and a back gate terminal of MN0 is connected to a signal vbn. A gate terminal of MP0 is connected to a gate terminal of MN0, to form an input terminal (represented by A) of a NOT gate. A drain terminal of MP0 is connected to a drain terminal of MN0, to form an output terminal (represented by Y) of the NOT gate.

Figure 3:
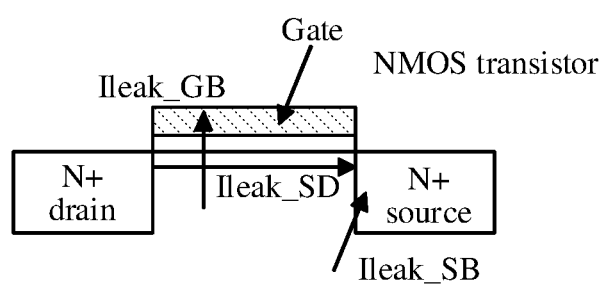
FIG. 3 illustrates a schematic diagram of distribution of a leakage current of an NMOS transistor.

In the design of the LPDDR storage device, the main focus is leakage currents such as a source/substrate leakage current, a drain/substrate leakage current, a source/drain leakage current, and a gate/substrate leakage current of a logic gate circuit. An NMOS transistor is taken as an example. FIG. 3 illustrates a schematic diagram of distribution of a leakage current of an NMOS transistor. As illustrated in FIG. 3, the source/drain leakage current may be represented by Ileak_SD, the source/substrate leakage current may be represented by Ileak_SB, and the gate/substrate leakage current may be represented by Ileak_GB. In addition, it needs to be noted that the source/drain leakage current may be alternatively represented by Ioff.

However, in response to that a substrate voltage is the same as a source voltage, a transistor has a relatively low threshold voltage, a high saturation current, and a fast transmission speed. At this time, a leakage current between a source and a drain is slightly high, resulting in relatively high power consumption.

Based on this, embodiments of the disclosure provide a control circuit. Based on the control circuit, while ensuring that the performance of a semiconductor meets requirements, a target signal may be received through the bias switching circuit to switch a bias voltage, so that the threshold voltage of the target transistor can be increased, a saturation current can be reduced, while reducing a leakage current between a source and a drain, thereby reducing power consumption.

The embodiments of the disclosure are described below in detail with reference to the accompanying drawings.

Figure 4:
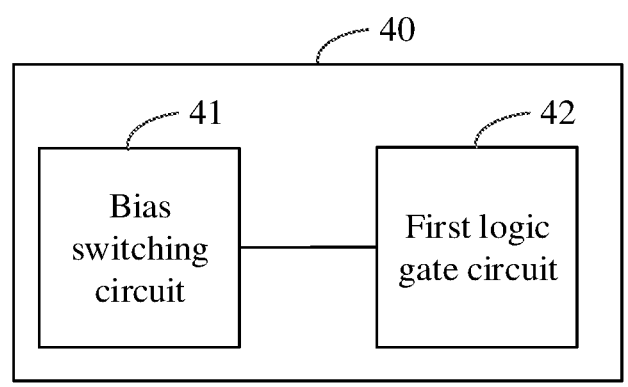
FIG. 4 illustrates a schematic structural diagram 1 of a control circuit according to embodiments of the disclosure.

In an embodiment of the disclosure, FIG. 4 illustrates a schematic structural diagram 1 of a control circuit according to embodiments of the disclosure. As illustrated in FIG. 4, the control circuit 40 may include a bias switching circuit 41 and a first logic gate circuit 42.

The first logic gate circuit 42 includes at least one target transistor. A substrate of one of the at least one target transistor is connected to an output terminal of the bias switching circuit 41. The first logic gate circuit 42 has a first speed mode and a second speed mode. A transmission speed of the first speed mode is less than a transmission speed of the second speed mode.

The bias switching circuit 41 is configured to: receive a target signal, and in response to that the target signal is in an enabled state, output a target bias voltage to increase a threshold voltage of the target transistor. The enabled state of the target signal represents that the first logic gate circuit 42 is in the first speed mode.

It needs to be noted that in the embodiments of the disclosure, after receiving the target signal, if the target signal is in the enabled state, that is, the first logic gate circuit 42 is in the first speed mode, the bias switching circuit 41 may output the target bias voltage, and supply the target bias voltage to the substrate of the target transistor forming the first logic gate circuit 42 to increase the threshold voltage of the target transistor, thereby reducing a leakage current between a source and a drain of the target transistor.

Further, for the bias switching circuit 41, after the target signal is received, the target signal may be in a disabled state. Therefore, in some embodiments, the bias switching circuit 41 is further configured to output an initial bias voltage to decrease the threshold voltage of the target transistor, if the target signal is in a disabled state. The disabled state of the target signal represents that the first logic gate circuit is in the second speed mode.

In the embodiments of the disclosure, whether the target signal is in the enabled state or the disabled state may be determined according to whether the first logic gate circuit 42 operates at a high speed state. Specifically, if the first logic gate circuit 42 operates at a high speed state, that is, in the second speed mode, the target signal is in the disabled state. If the first logic gate circuit 42 operates at a low speed state, that is, in the first speed mode, the target signal is in the enabled state. That is, in the embodiments of the disclosure, in a DVFSC mode (that is, a low speed mode), a bias voltage may be changed to increase a threshold voltage (represented by Vth), so that the leakage current (represented by Ioff) between the source and the drain of the target transistor can be reduced. In this case, the power consumption can be reduced while it is ensured that a transmission speed meets requirements.

In some embodiments, if the target signal is in a first level state, it is determined that the target signal is in the enabled state. If the target signal is in a second level state, it is determined that the target signal is in the disabled state (that is, an unenabled state). For example, the first level state is a high level, and the second level state is a low level. However, this is not specifically limited herein.

In this way, in the embodiments of the disclosure, the bias switching circuit 41 may be used to change a bias voltage. For the bias switching circuit 41, after the target signal is received, if the target signal is in the disabled state, voltage switching needs to be performed on the initial bias voltage, and the target bias voltage different from the initial bias voltage. In this case, the target bias voltage is supplied to the substrate of the target transistor to increase the threshold voltage of the target transistor, so that the leakage current between the source and the drain of the target transistor can be reduced. In contrast, if the target signal is in the disabled state, voltage switching does not need to be performed on the initial bias voltage, and the initial bias voltage is directly outputted. In this case, the initial bias voltage is supplied to the substrate of the target transistor, that is, the voltage of the substrate of the target transistor is not switched, and at this time the leakage current between the source and the drain of the target transistor does not need to be reduced.

In some embodiments, for the target transistor forming the first logic gate circuit 42, the target transistor may include two types of transistors, specifically, a first-type transistor and a second-type transistor. Threshold voltages of different types of transistors are adjusted in different manners. The first-type transistor may be a PMOS transistor, and the second-type transistor may be an NMOS transistor. Alternatively, the first-type transistor may be an NMOS transistor, and the second-type transistor may be a PMOS transistor.

Figure 5:
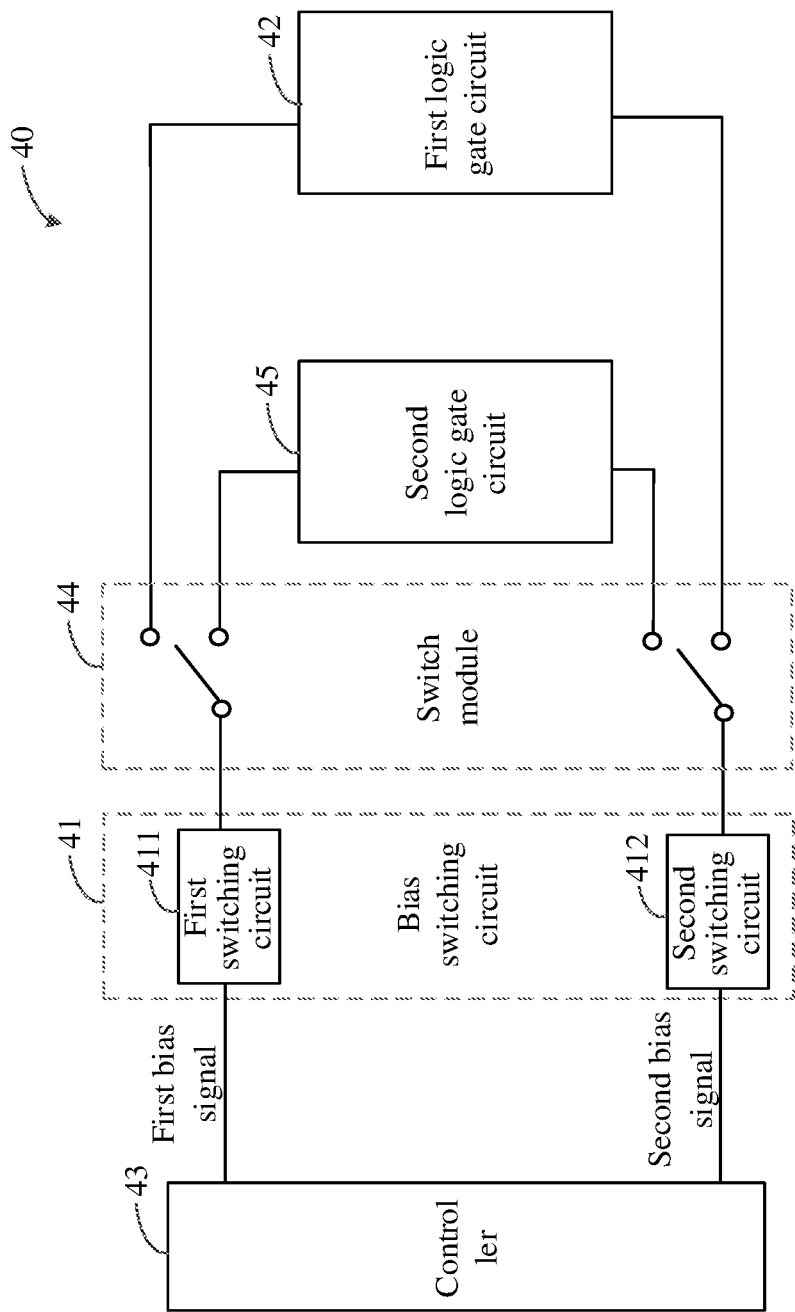
FIG. 5 illustrates a schematic structural diagram 2 of the control circuit according to embodiments of the disclosure.

Further, for the two types of transistors, based on the control circuit 40 shown in FIG. 4, as shown in FIG. 5, the bias switching circuit 41 may include a first switching circuit 411 and a second switching circuit 412.

The first switching circuit 411 is configured to: receive a first bias signal; output a first target bias voltage corresponding to a first-type transistor in response to that the first bias signal is in the enabled state; and output a first initial bias voltage corresponding to the first-type transistor in response to that the first bias signal is in a disabled state.

The second switching circuit 412 is configured to: receive a second bias signal; output a second target bias voltage corresponding to a second-type transistor in response to that the second bias signal is in the enabled state; and output a second initial bias voltage corresponding to the second-type transistor in response to that the second bias signal is in the disabled state.

It needs to be noted that in the embodiments of the disclosure, the first switching circuit 411 corresponds to the first-type transistor. After receiving the first bias signal, it is determined, according to whether the first bias signal is in the enabled state, whether to perform voltage switching on the initial bias voltage (that is, the first initial bias voltage) of the first-type transistor. The second switching circuit 412 corresponds to the second-type transistor. After receiving the second bias signal, it is determined, according to whether the second bias signal is in the enabled state, whether to perform voltage switching on the initial bias voltage (that is, the second initial bias voltage) of the second-type transistor.

In a specific embodiment, if the first-type transistor is a PMOS transistor and the second-type transistor is an NMOS transistor, the first target bias voltage corresponding to the first-type transistor is higher than the first initial bias voltage, and the second target bias voltage corresponding to the second-type transistor is lower than the second initial bias voltage. If the first-type transistor is an NMOS transistor and the second-type transistor is a PMOS transistor, the first target bias voltage corresponding to the first-type transistor is lower than the first initial bias voltage, and the second target bias voltage corresponding to the second-type transistor is higher than the second initial bias voltage.

That is, in the embodiments of the disclosure, for a PMOS transistor, a corresponding target bias voltage is higher than the initial bias voltage. For an NMOS transistor, a corresponding target bias voltage is lower than the initial bias voltage. In this way, a threshold voltage of the PMOS transistor/NMOS transistor can be increased, a saturation current can be reduced, and the leakage current between the source and the drain of the target transistor can be reduced.

Figure 6A:
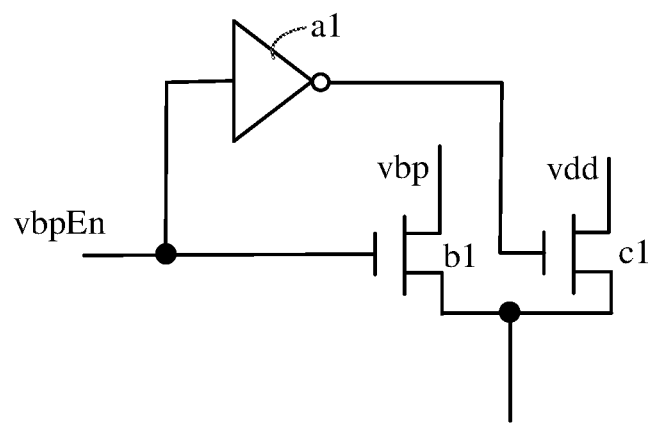
FIG. 6A illustrates a schematic structural diagram 1 of a first switching circuit according to embodiments of the disclosure.

Further, for the first switching circuit 411, in some embodiments, as shown in FIG. 6A, the first switching circuit 411 may include a first NOT gate a1, a first transistor b1, and a second transistor c1.

A drain of the first transistor b1 is connected to the first target bias voltage. A drain of the second transistor c1 is connected to the first initial bias voltage. A gate of the first transistor b1 is connected to an input terminal of the first NOT gate a1, and is configured to receive the first bias signal. A gate of the second transistor c1 is connected to an output terminal of the first NOT gate a1. A source of the first transistor b1 is connected to a source of the second transistor c1, and is configured to output a first output bias voltage.

It needs to be noted that in the embodiments of the disclosure, in response to that the first bias signal is in the enabled state, the first transistor b1 is turned on, and the first output bias voltage to be output is determined to be the first target bias voltage. In response to that the first bias signal is in the disabled state, the second transistor c1 is turned on, and the first output bias voltage to be output is determined to be the first initial bias voltage.

It further needs to be noted that in the embodiments of the disclosure, it is assumed that the first switching circuit 411 corresponds to a PMOS transistor. In this case, the first bias signal may be represented by vbpEn, the first target bias voltage may be represented by vbp, the first initial bias voltage may be represented by vdd, and a voltage value corresponding to vdd is lower than a voltage value corresponding to vbp.

That is, if the signal vbpEn is in the enabled state, the first transistor b1 may be turned on. In this case, the first output bias voltage is vbp. If the signal vbpEn is in the disabled state, the signal vbpEn is inverted by the first NOT gate a1, and the second transistor c1 may be turned on. In this case, the first output bias voltage is vdd. In this way, for the PMOS transistor, if the signal vbpEn is in the enabled state, a substrate voltage supplied to the PMOS transistor is vbp. Compared with initial vdd, the substrate voltage is increased, so that a threshold voltage of the PMOS transistor can be increased, thereby reducing a leakage current between a source and a drain of the PMOS transistor.

Figure 6B:
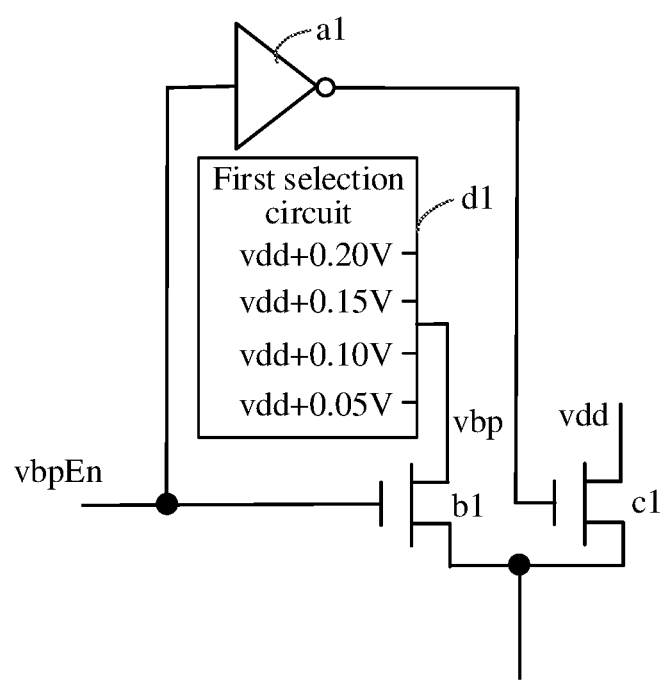
FIG. 6B illustrates a schematic structural diagram 2 of the first switching circuit according to embodiments of the disclosure.

Further, for the first switching circuit 411, in some embodiments, as shown in FIG. 6B, the first switching circuit 411 may further include a first selection circuit d1. The first selection circuit d1 includes multiple ports each corresponding to a respective first candidate bias voltage.

The first selection circuit d1 is configured to: receive a first selection signal, determine a target port according to the first selection signal, and determine a first candidate bias voltage corresponding to the target port as the first target bias voltage.

It needs to be noted that in the embodiments of the disclosure, for the voltage vbp, multiple levels may be set. Each port corresponds to a respective level. Each level corresponds to a respective first candidate bias voltage. After a target port is determined, the first candidate bias voltage corresponding to the target port (that is, the level) may be used as a first target bias voltage to be outputted.

Exemplarily, as shown in FIG. 6B, it is assumed that the first selection circuit d1 includes four ports. The voltage vdd is used as a reference. First candidate bias voltages corresponding to the four ports are respectively vdd+0.20 V, vdd+0.15 V, vdd+0.10 V, and vdd+0.05 V. In this way, if the signal vbpEn is in the enabled state, the substrate voltage supplied to the PMOS transistor is definitely greater than vdd, so that the substrate voltage can be increased, thereby reducing the leakage current between the source and the drain of the PMOS transistor.

Figure 7A:
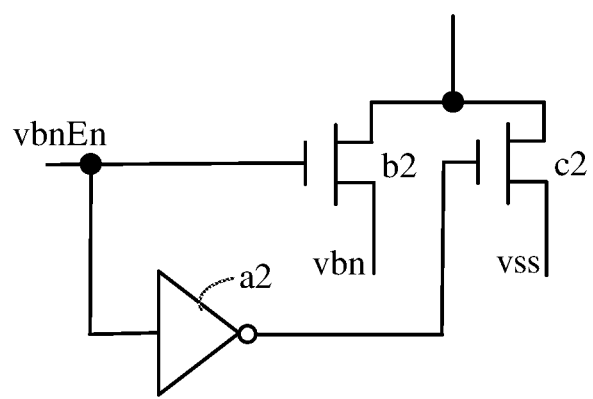
FIG. 7A illustrates a schematic structural diagram 1 of a second switching circuit according to embodiments of the disclosure.

Further, for the second switching circuit 412, in some embodiments, as shown in FIG. 7A, the second switching circuit 412 may include a second NOT gate a2, a third transistor b2, and a fourth transistor c2.

A source of the third transistor b2 is connected to the second target bias voltage. A source of the fourth transistor c2 is connected to the second initial bias voltage. A gate of the third transistor b2 is connected to an input terminal of the second NOT gate a2, and is configured to receive the second bias signal. A gate of the fourth transistor c2 is connected to an output terminal of the second NOT gate a2. A drain of the third transistor b2 is connected to a drain of the fourth transistor c2, and is configured to output a second output bias voltage.

It needs to be noted that in the embodiments of the disclosure, in response to that the second bias signal is in the enabled state, the third transistor b2 is turned on, and the second output bias voltage is determined to be the second target bias voltage. In response to that the second bias signal is in the disabled state, the fourth transistor c2 is turned on, and the second output bias voltage is determined to be the second initial bias voltage.

It further needs to be noted that in the embodiments of the disclosure, it is assumed that the second switching circuit 412 corresponds to an NMOS transistor. In this case, the second bias signal may be represented by vbnEn, the second target bias voltage may be represented by vbn, the second initial bias voltage may be represented by vss, and a voltage value corresponding to vss is greater than a voltage value corresponding to vbn.

That is, if the signal vbnEn is in the enabled state, the third transistor b2 may be turned on. In this case, the second output bias voltage is vbn. If the signal vbnEn is in the disabled state, the signal vbnEn is inverted by the second NOT gate a2, and the fourth transistor c2 may be turned on. In this case, the second output bias voltage is vss. In this way, for the NMOS transistor, if the signal vbnEn is in the enabled state, a substrate voltage supplied to the NMOS transistor is vbn. Compared with the initial vss, the substrate voltage is decreased, so that a threshold voltage of the NMOS transistor can be increased, thereby reducing a leakage current between a source and a drain of the NMOS transistor.

Figure 7B:
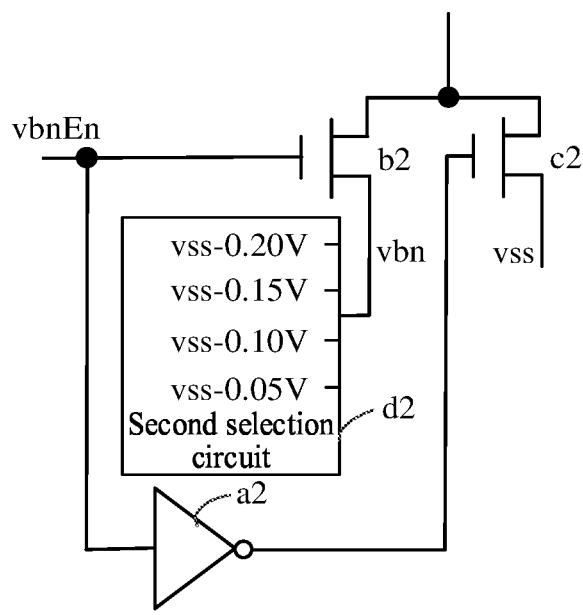
FIG. 7B illustrates a schematic structural diagram 2 of the second switching circuit according to embodiments of the disclosure.

Further, for the second switching circuit 412, in some embodiments, as shown in FIG. 7B, the second switching circuit 412 may further include a second selection circuit d2. The second selection circuit d2 includes multiple ports each corresponding to a respective different second candidate bias voltage.

The second selection circuit d2 is configured to: receive a second selection signal, determine a target port according to the second selection signal, and determine a second candidate bias voltage corresponding to the target port as the second target bias voltage.

It needs to be noted that in the embodiments of the disclosure, for the voltage vbn, multiple levels may be set. Each port corresponds to a respective level. Each level corresponds to a respective second candidate bias voltage. After a target port is determined, a second candidate bias voltage corresponding to the target port (that is, the level) may be used as a second target bias voltage to be outputted.

Exemplarily, as shown in FIG. 7B, it is assumed that the second selection circuit d2 includes four ports. The voltage vss is used as a reference. Second candidate bias voltages corresponding to the four ports are respectively vss-0.20 V, vss-0.15 V, vss-0.10 V, and vss-0.05 V. In this way, if the signal vbnEn is in the enabled state, the substrate voltage supplied to the NMOS transistor is definitely lower than vss, so that the substrate voltage can be decreased, thereby reducing the leakage current between the source and the drain of the NMOS transistor.

Further, for the two types of transistors (the first-type transistor and the second-type transistor), in some embodiments, when the first-type transistor is a PMOS transistor and the second-type transistor is an NMOS transistor, it is determined that the first candidate bias voltage corresponding to each port of the first selection circuit is greater than the first initial bias voltage, and the second candidate bias voltage corresponding to each port of the second selection circuit is lower than the second initial bias voltage.

When the first-type transistor is an NMOS transistor and the second-type transistor is a PMOS transistor, it is determined that the first candidate bias voltage corresponding to each port of the first selection circuit is lower than the first initial bias voltage, and the second candidate bias voltage corresponding to each port of the second selection circuit is higher than the second initial bias voltage.

To put it simply, in the low speed state, in order to reduce a leakage current between a source and a drain of a transistor, for a PMOS transistor, a substrate voltage needs to be increased, and for an NMOS transistor, a substrate voltage needs to be reduced. In addition, the embodiments of the disclosure further provide an adjustable substrate voltage, that is, the substrate voltage of the PMOS transistor is adjusted by using the first selection circuit d1, and the substrate voltage of the NMOS transistor is adjusted by using the second selection circuit d2, to prevent the selection of the substrate voltage from causing an excessively large gate/substrate leakage current.

Figure 8:
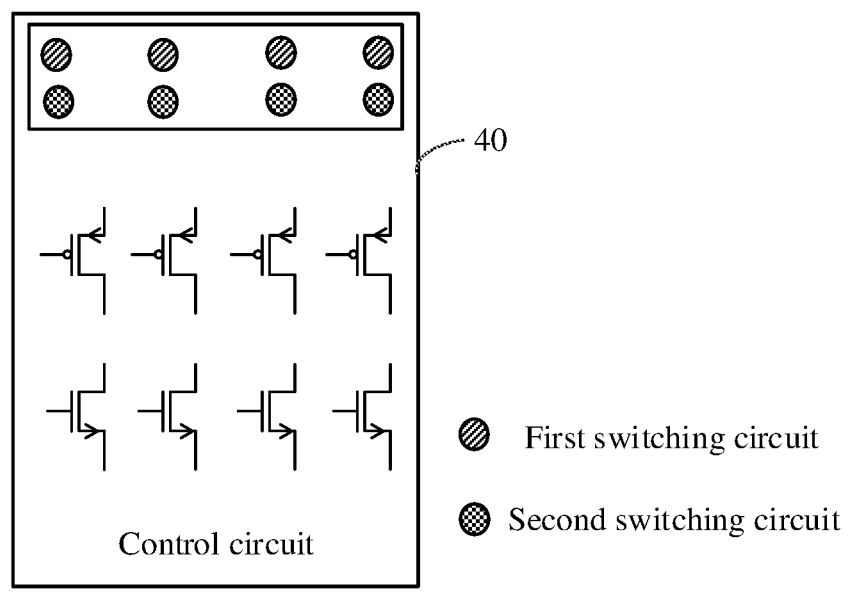
FIG. 8 illustrates a schematic structural diagram 3 of the control circuit according to embodiments of the disclosure.

Further, in the embodiments of the disclosure, as shown in FIG. 8, the control circuit 40 may include multiple first-type transistors and multiple second-type transistors.

In a possible implementation, if there is one first switching circuit 411 and there is one second switching circuit 412, the bias switching circuit 41 is further configured to: supply a first output bias voltage to the multiple first-type transistors through the first switching circuit 411 simultaneously, and supply a second output bias voltage to the multiple second-type transistors through the second switching circuit 412 simultaneously.

In another possible implementation, if there are multiple first switching circuits 411 and there are multiple second switching circuits 412, the bias switching circuit 41 is further configured to: supply a first output bias voltage to the multiple first-type transistors simultaneously through one first switching circuit 411, and supply a second output bias voltage to the multiple second-type transistors simultaneously through one second switching circuit 412.

In still another possible implementation, if there are multiple first switching circuits 411 and there are multiple second switching circuits 412, the bias switching circuit 41 is further configured to: supply a first output bias voltage to the multiple first-type transistors through the multiple first switching circuits 411 respectively, and supply a second output bias voltage to the multiple second-type transistors through the multiple second switching circuits 412 respectively.

It needs to be noted that in the embodiments of the disclosure, there is time restriction for the switching of the substrate voltage, and the switching needs to be completed within a period in which the target signal is enabled/disabled. Because a capacitance accumulated by capacitances between sources/substrates of millions of logic gates is very large, charging/discharging is required. In this case, the first switching circuit 411 and the second switching circuit 412 need to be distributed in the control circuit 40, and a quantity of switching circuits to be enabled in the multiple first switching circuits 411 and the multiple second switching circuits 412 may be selected according to an actual requirement.

That is, if the control circuit 40 may include multiple first-type transistors and second-type transistors, when there are multiple first switching circuits 411 and multiple second switching circuits 412, for the multiple first-type transistors, it may be selected to enable one first switching circuit, that is, to use one first switching circuit to simultaneously supply power to the multiple first-type transistors, or it may be selected to enable the multiple first switching circuits, that is, to use the multiple first switching circuits to correspondingly supply power to the multiple first-type transistors respectively, or it may be selected to enable some of the multiple first switching circuits, that is, to use some of the first switching circuits to supply power to the multiple first-type transistors. Similarly, for the multiple second-type transistors, it may be selected to enable one second switching circuit, that is, to use one second switching circuit to simultaneously supply power to the multiple first-type transistors, or it may be selected to enable the multiple second switching circuits, that is, to use the multiple second switching circuits to correspondingly supply power to the multiple first-type transistors respectively, or it may be selected to enable some of the second switching circuits, that is, to use some of the second switching circuits to supply power to the multiple first-type transistors. In this way, if each first switching circuit corresponds to a respective first-type transistor for charging and each second switching circuit corresponds to a respective second-type transistor in charging, the charging and discharging speeds can be increased.

In some embodiments, based on the control circuit 40 shown in FIG. 4, as shown in FIG. 5, the control circuit 40 may further include a controller 43.

The controller 43 is configured to: control the target signal to be in the enabled state in response to that the first logic gate circuit 42 is in the first speed mode and a leakage current of the target transistor is greater than or equal to a preset value; and control the target signal to be in a disabled state in response to that the first logic gate circuit 42 is in the second speed mode or in response to that the first logic gate circuit 42 is in the first speed mode and the leakage current of the target transistor is less than the preset value.

It needs to be noted that in the embodiments of the disclosure, if the leakage current of the target transistor is less than the preset value, it indicates that the performance of the target transistor already meet requirements, and it is no longer necessary to change the substrate voltage of the target transistor to reduce the leakage current. The substrate voltage of the target transistor needs to be switched to reduce a leakage current between a source and a drain, only when the first logic gate circuit 42 is in the first speed mode and the leakage current of the target transistor is greater than or equal to the preset value.

It further needs to be noted that in the embodiments of the disclosure, the target transistor may include a PMOS transistor and/or an NMOS transistor. If the target transistor is a PMOS transistor, the target signal is the first bias signal (represented by the signal vbpEn). If the target transistor is an NMOS transistor, the target signal is the second bias signal (represented by the signal vbnEn). Whether to switch substrate voltages of a PMOS transistor and an NMOS transistor is described below in detail with reference to several cases.

In a possible implementation, when the first logic gate circuit 42 is in the first speed mode and a leakage current of the PMOS transistor and a leakage current of the NMOS transistor are both greater than or equal to the preset value, the controller 43 is configured to control the first bias signal to be in the enabled state and control the second bias signal to be in the enabled state.

The first logic gate circuit 42 is configured to supply the first target bias voltage to a substrate of the PMOS transistor and supply the second target bias voltage to a substrate of the NMOS transistor, to switch both the substrate voltage of the PMOS transistor and the substrate voltage of the NMOS transistor, thereby reducing a leakage current between a source and a drain of the PMOS transistor and a leakage current between a source and a drain of the NMOS transistor.

In another possible implementation, when the first logic gate circuit 42 is in the first speed mode, a leakage current of the PMOS transistor is greater than or equal to the preset value, and a leakage current of the NMOS transistor is less than the preset value, the controller 43 is configured to control the first bias signal to be in the enabled state and control the second bias signal to be in the disabled state.

The first logic gate circuit 42 is configured to supply the first target bias voltage to a substrate of the PMOS transistor and supply the second initial bias voltage to a substrate of the NMOS transistor, to switch the substrate voltage of the PMOS transistor, thereby reducing a leakage current between a source and a drain of the PMOS transistor.

In still another possible implementation, when the first logic gate circuit 42 is in the first speed mode, a leakage current of the PMOS transistor is less than the preset value, and a leakage current of the NMOS transistor is greater than or equal to the preset value, the controller 43 is configured to control the first bias signal to be in the disabled state and control the second bias signal to be in the enabled state.

The first logic gate circuit 42 is configured to supply the first initial bias voltage to a substrate of the PMOS transistor and supply the second target bias voltage to a substrate of the NMOS transistor, to switch the substrate voltage of the NMOS transistor, thereby reducing a leakage current between a source and a drain of the NMOS transistor.

In yet another possible implementation, when the first logic gate circuit 42 is in the first speed mode and a leakage current of the PMOS transistor and a leakage current of the NMOS transistor are both less than the preset value, the controller 43 is configured to control the first bias signal to be in the disabled state and control the second bias signal to be in the disabled state.

The first logic gate circuit 42 is configured to supply the first initial bias voltage to a substrate of the PMOS transistor and supply the second initial bias voltage to a substrate of the NMOS transistor, to switch neither the substrate voltage of the PMOS transistor nor the substrate voltage of the NMOS transistor.

That is, in the embodiments of the disclosure, the switching of a substrate voltage is not suitable for all transistors. For example, for a high speed transistor or a transistor (a gate oxide layer is very thin) with a low threshold voltage, a gate/substrate leakage current may be excessively large. If the gate/substrate leakage current is greater than a decrease value of a leakage current between a source and a drain. In such as case, voltage switching should not be performed, and the initial bias voltage is still supplied to a substrate of the transistor, to prevent the gate/substrate leakage current of the transistor from being excessively large. In addition, even for a low speed transistor, because there may be great changes in a process condition, in this case, the voltage vbp and the voltage vbn may be separately enabled according to the process condition. For example, after silicon processing, if it is found that the leakage current of the PMOS transistor is very small and does not affect a leakage current of an entire circuit but the leakage current of the NMOS transistor has relatively high impact, the voltage vbn may be used only so as to switch the substrate voltage of the NMOS transistor. This is not limited in the embodiments of the disclosure.

In some embodiments, based on the control circuit 40 shown in FIG. 4, as shown in FIG. 5, the control circuit 40 may further include a switch module 44 and a second logic gate circuit 45.

The switch module 44 is configured to: control a selector switch inside the switch module to be gated to the first logic gate circuit 42 in response to that a transmission speed meets the first speed mode or the second speed mode; or control a selector switch inside the switch module to be gated to the second logic gate circuit 45 in response to that a transmission speed meets a third speed mode.

The second logic gate circuit 45 is formed by at least one target transistor. A substrate of one of the at least one target transistor is connected to the output terminal of the bias switching circuit, and is configured to receive an initial bias voltage outputted by the bias switching circuit, to reduce the threshold voltage of the target transistor of the second logic gate. The second logic gate circuit has the third speed mode, and the transmission speed corresponding to the second speed mode is less than a transmission speed corresponding to the third speed mode.

Here, for the first logic gate circuit 42 or the second logic gate circuit 45, the transmission speed may include an ultra-high speed state, a high speed state, and a low speed state. The transmission speed corresponding to the third speed mode meets the ultra-high speed state. The transmission speed corresponding to the second speed mode meets the high speed state. The transmission speed corresponding to the first speed mode meets the low speed state.

If the current transmission speed meets the third speed mode, the selector switch inside the switch module 44 is gated to the second logic gate circuit 45. Then the initial bias voltage is supplied to the substrate of the target transistor forming the second logic gate circuit 45, to reduce the threshold voltage of the target transistor. If the current transmission speed meets the first speed mode or the second speed mode, the selector switch inside the switch module 44 is gated to the first logic gate circuit 42. At this time, there are two cases: If the present transmission speed meets the first speed mode, it indicates that the target signal is in the enabled state, and the bias switching circuit 41 may be used to output the target bias voltage. Then the target bias voltage is supplied to the substrate of the target transistor forming the first logic gate circuit 42 to increase the threshold voltage of the target transistor, thereby reducing a leakage current between a source and a drain of the target transistor. If the present transmission speed meets the second speed mode, it indicates that the target signal is in the disabled state, and the bias switching circuit 41 may be used to output the initial bias voltage. Then the initial bias voltage is supplied to the substrate of the target transistor forming the first logic gate circuit to reduce the threshold voltage of the target transistor, to prevent the gate/substrate leakage current of the transistor from being excessively large, thereby avoiding affecting the leakage current of the entire circuit.

Embodiments of the disclosure provide a control circuit. Based on the control circuit 40, while ensuring that the semiconductor performance meets requirements, the control circuit uses the bias switching circuit to perform voltage switching on the initial bias voltage, so that the threshold voltage of the target transistor can be increased, a saturation current can be reduced, and a leakage current between a source and a drain can be reduced, thereby reducing power consumption.

Figure 9:
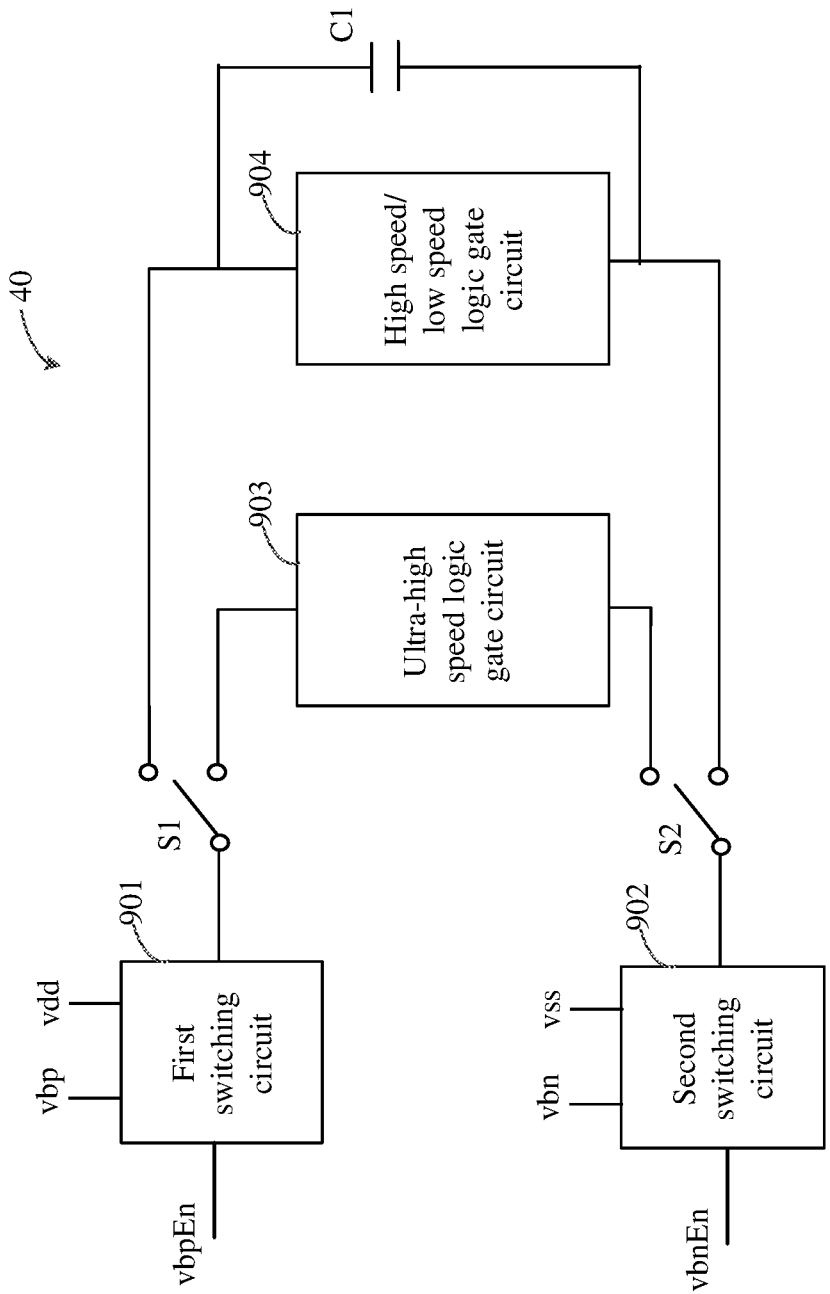
FIG. 9 illustrates a schematic structural diagram 4 of the control circuit according to embodiments of the disclosure.

In another embodiment of the disclosure, FIG. 9 illustrates a schematic structural diagram 4 of a control circuit according to embodiments of the disclosure. As shown in FIG. 9, the control circuit 40 may include a first switching circuit 901, a second switching circuit 902, a first selector switch S1, a second selector switch S2, an ultra-high speed logic gate circuit 903, a high speed/low speed logic gate circuit 904, and an equivalent capacitor C1. For the specific structure of the first switching circuit 901, reference may be made to the foregoing FIG. 6A or FIG. 6B. For the specific structure of the second switching circuit 902, reference may be made to the foregoing FIG. 7A or FIG. 7B.

It needs to be noted that in the embodiments of the disclosure, if the first selector switch S1 is gated to the ultra-high speed logic gate circuit 903, for a substrate voltage of a PMOS transistor in the ultra-high speed logic gate circuit 903, a voltage vdd outputted by the first switching circuit 901 may be used to supply power. If the second selector switch S2 is gated to the ultra-high speed logic gate circuit 903, for a substrate voltage of an NMOS transistor in the ultra-high speed logic gate circuit 903, a voltage vss outputted by the second switching circuit 902 may be used to supply power. It needs to be noted that because the voltage vdd and the voltage vss are both initial bias voltages, for the ultra-high speed logic gate circuit 903, the substrate voltage of the PMOS transistor may be directly connected to the voltage vdd, and the substrate voltage of the NMOS transistor is directly connected to the voltage vss, without using the first switching circuit 901 and the second switching circuit 902.

Specifically, if the first selector switch S1 is gated to the high speed/low speed logic gate circuit 904, for a substrate voltage of a PMOS transistor in the high speed/low speed logic gate circuit 904, a voltage vdd/a voltage vbp outputted by the first switching circuit 901 may be used to supply power. If the high speed/low speed logic gate circuit 904 operates at a low speed state, in this case, the signal vbpEn is in the enabled state. The first switching circuit 901 outputs a voltage vbp, and then the voltage vbp is supplied to a substrate of the PMOS transistor. Otherwise, if the high speed/low speed logic gate circuit 904 operates at a high speed state, in this case, the signal vbpEn is in the disabled state. The first switching circuit 901 outputs a voltage vdd, and then the voltage vdd is supplied to the substrate of the PMOS transistor. In addition, it needs to be noted that the first switching circuit 901 may be considered as a selector switch. Here, if the signal vbpEn is in the enabled state, the selector switch is controlled to be gated to the first terminal to output the voltage vdd. In this case, the substrate voltage of the PMOS transistor is not changed. If the signal vbpEn is in the disabled state, the selector switch is controlled to be gated to the second terminal to output the voltage vbp. In this case, the substrate voltage of the PMOS transistor is changed. That is, the specific structure of the first switching circuit 901 is not limited in the embodiments of the disclosure.

Similarly, if the second selector switch S2 is gated to the high speed/low speed logic gate circuit 904, for a substrate voltage of an NMOS transistor in the high speed/low speed logic gate circuit 904, a voltage vss/a voltage vbn outputted by the second switching circuit 902 may be used to supply power. If the high speed/low speed logic gate circuit 904 operates at a low speed state, in this case, the signal vbnEn is in the enabled state. The second switching circuit 902 outputs a voltage vbn, and then the voltage vbn is supplied to a substrate of the NMOS transistor. Otherwise, if the high speed/low speed logic gate circuit 904 operates at a high speed state, in this case, the signal vbnEn is in the disabled state. The second switching circuit 902 outputs a voltage vss, and then the voltage vss is supplied to a substrate of the NMOS transistor. In addition, it needs to be noted that the second switching circuit 902 may be considered as a selector switch. Here, if the signal vbpnEn is in the enabled state, the selector switch is controlled to be gated to the first terminal to output the voltage vss. In this case, the substrate voltage of the NMOS transistor is not changed. If the signal vbnEn is in the disabled state, the selector switch is controlled to be gated to the second terminal to output the voltage vbn. In this case, the substrate voltage of the NMOS transistor is changed. That is, the specific structure of the second switching circuit 902 is not limited in the embodiments of the disclosure.

It further needs to be noted that in the embodiments of the disclosure, the high speed/low speed logic gate circuit 904 is used as an example. The substrate voltage of the PMOS transistor is increased to charge the substrate, and the substrate voltage of the NMOS transistor is decreased to discharge the substrate. Transistors such as the PMOS transistor and the NMOS transistor in the high speed/low speed logic gate circuit 904 may be equivalent to a capacitor C1. That is, the switching of the substrate voltage requires a time restriction, and needs to be completed within a period in which the low speed state (that is, the signal DVFSC) is enabled/disabled. Because the capacitance accumulated by capacitances between sources/substrates of millions of logic gates is very large, charging/discharging is required.

Figure 10:
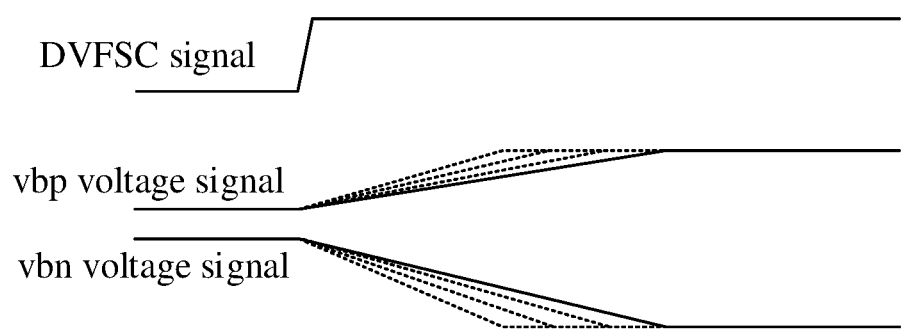
FIG. 10 illustrates a schematic diagram of timing sequence of a signal of a control circuit according to embodiments of the disclosure.

Exemplarily, FIG. 10 illustrates a schematic diagram of timing sequence of a signal of a control circuit according to embodiments of the disclosure. As shown in FIG. 10, the signal DVFSC is used for representing whether the control circuit operates at a low speed state, that is, whether the foregoing target signal is in an enabled state. The voltage signal vbp is used for representing whether the substrate voltage of the PMOS transistor is switched, and the voltage signal vbn is used for representing whether the substrate voltage of the NMOS transistor is switched. In FIG. 10, when the signal DVFSC changes from a low level to a high level (that is, in the enabled state, and in this case, the control circuit operates at a low speed state), both the voltage signal vbp and the voltage signal vbn change from a low level to a high level. That is, the substrate voltage of the PMOS transistor/NMOS transistor needs to be switched to perform charging/discharging. In addition, in FIG. 10, a PMOS transistor is used as an example. For the same PMOS transistor, due to process reasons, the substrate voltage may be switched to different voltage values (for example, 1.2 V, 1.15 V, 1.10 V, or 1.05 V). Due to the difference in the equivalent capacitance C1 and the charging voltage, a charging speed varies, and the slope of the voltage signal vbp also varies. Similarly, for the same NMOS transistor, due to a difference in a discharging speed, the slope of the voltage signal vbn also varies.

In a specific embodiment, in a DRAM design (especially LPDDR5), for the design of voltage switching of a substrate, there are the following constraint conditions:

(1) A change in a substrate voltage needs to follow switching of an operating state of a DRAM. The focus is performance in the case of a high frequency. Substrate voltage=power supply voltage/grounding voltage (in this case, a dual power supply design is used, and a selector switch is used for control).

(2) The switching of the substrate voltage has a time restriction, and needs to be completed within a period in which the DVFSC signal is enabled/disabled. Because the capacitance accumulated by capacitances between sources/substrates of millions of logic gates is very large, charging/discharging is required. In this case, the first switching circuit and the second switching circuit need to be distributed in the control circuit, and a quantity of switching circuits to be enabled among multiple first switching circuits and among multiple second switching circuits may be selected according to an actual requirement.

(3) The switching of a substrate voltage is not suitable for all transistors. For example, for a high speed transistor or a transistor (a gate oxide layer is very thin) with a low threshold, a gate/substrate leakage current may be excessively large. If the gate/substrate leakage current is greater than a decrease value of a source/drain leakage current, the switching of the substrate voltage should not be performed.

(4) For a switching circuit, the selection of the substrate voltage should not cause an excessively large gate/ substrate leakage current. Therefore, an adjustable substrate voltage may be supplied (for example, implemented by using the first selection circuit or the second selection circuit).

(5) Due to great changes in process conditions, the voltage vbp and the voltage vbn may be separately enabled according to the process conditions. For example, after silicon processing, if it is found that the leakage current of the PMOS transistor is very small and does not affect a leakage current of the entire control circuit but the leakage current of the NMOS transistor has relatively large impact, the voltage vbn may be turned on only so as to switch the substrate voltage of the NMOS transistor.

Based on this, embodiments of the disclosure provide a control circuit. The specific implementations of the foregoing embodiments are detailed in detail in the present embodiment. As can be seen, based on the technical solution in the embodiments of the disclosure, for a DVFSC mode (that is, a low speed mode), while ensuring that the semiconductor performance meets requirements, a first switching circuit and/or a second switching circuit is used to switch a bias voltage, so that the threshold voltage of the target transistor can be increased, a saturation current can be reduced, and a leakage current between a source and a drain can be reduced, thereby reducing power consumption.

Figure 11:
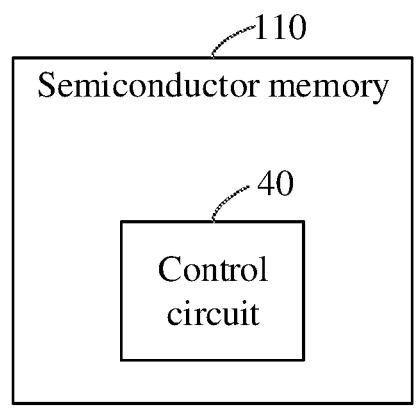
FIG. 11 illustrates a schematic structural diagram of a semiconductor memory according to embodiments of the disclosure.

In still another embodiment of the disclosure, FIG. 11 illustrates a schematic structural diagram of a semiconductor memory 110 according to embodiments of the disclosure. As shown in FIG. 11, the semiconductor memory 110 may include any control circuit 40 in the foregoing embodiments.

In the embodiments of the disclosure, the semiconductor memory 110 may be a DRAM chip.

Further, in some embodiments, the DRAM chip meets DDR5 memory specifications.

It needs to be noted that the embodiments of the disclosure relate to the design of semiconductor integrated circuits, and in particular, to a power saving circuit. Specifically, the technical solution in the embodiments of the disclosure mainly provides a design that can implement a power saving circuit in an LPDDR5 DVFSC mode. In this case, in the DVFSC mode, a Bulk bias voltage is changed to increase a threshold voltage of a transistor, so that a leakage current between a source and a drain can be reduced. In this case, it can be ensured that while ensuring that a transmission speed meets requirements, a lower power consumption can be implemented.

To put it simply, in the embodiments of the disclosure, the semiconductor memory 110 includes a control circuit 40. Therefore, while ensuring that the semiconductor performance meets requirements, the control circuit uses the bias switching circuit to switch a bias voltage, so that the threshold voltage of the target transistor can be increased, a saturation current can be reduced, and a leakage current between a source and a drain can be reduced, thereby reducing power consumption.

The foregoing are merely preferred embodiments of the disclosure but are not used to limit the scope of protection of the disclosure.

It should be noted that the terms "include", "comprise", or any variation thereof in the disclosure are intended to cover a non-exclusive inclusion. Therefore, in the context of a process, method, object or apparatus that includes a series of elements, the process, method, object or apparatus not only includes these elements, but also includes other elements not specified expressly, or may include elements inherent to the process, method, object or apparatus. Without more limitations, an element limited by "include a/an . . . " does not exclude the process, the method, the object or the apparatus including the element from other same elements.

The foregoing sequence numbers embodiments of the disclosure are merely for the convenience of description, and do not imply the preference among the embodiments.

The methods disclosed in several method embodiments provided in the disclosure may be arbitrarily combined with each other without causing any conflict to obtain new method embodiments.

The features disclosed in several product embodiments provided in the disclosure may be arbitrarily combined with each other without causing any conflict to obtain new product embodiments.

The features disclosed in several method or device embodiments provided in the disclosure may be arbitrarily combined with each other without causing any conflict to obtain new method embodiments or device embodiments.

The foregoing descriptions are merely specific implementations of the disclosure, but are not intended to limit the protection scope of the disclosure. Any variation or replacement that may be readily conceivable to a person skilled in the art within the technical scope disclosed in the disclosure shall fall within the protection scope of the disclosure. Therefore, the protection scope of the disclosure shall be subject to the protection scope of the claims.

INDUSTRIAL APPLICABILITY

Embodiments of the disclosure provide a control circuit and a semiconductor memory. The control circuit includes a bias switching circuit and a first logic gate circuit. The first logic gate circuit is includes at least one target transistor. A substrate of one of the at least one target transistor is connected to an output terminal of the bias switching circuit. The first logic gate circuit has a first speed mode and a second speed mode. A transmission speed of the first speed mode is less than a transmission speed of the second speed mode. The bias switching circuit is configured to: receive a target signal, and in response to that the target signal is in an enabled state, output a target bias voltage to increase a threshold voltage of the target transistor. The enabled state of the target signal represents that the first logic gate circuit is in the first speed mode. In this way, while ensuring that the semiconductor performance meets requirements, the control circuit uses the bias switching circuit to receive the target signal to switch a bias voltage, so that the threshold voltage of the target transistor can be increased, a saturation current can be reduced, and a leakage current between a source and a drain can be reduced, thereby reducing power consumption.

The invention claimed is:

1. A control circuit, comprising a bias switching circuit and a first logic gate circuit, wherein
the first logic gate circuit comprises at least one target transistor, a substrate of one of the at least one target transistor is connected to an output terminal of the bias switching circuit, the first logic gate circuit has a first speed mode and a second speed mode, and a transmission speed of the first speed mode is lower than a transmission speed of the second speed mode; and
the bias switching circuit is configured to: receive a target signal, and in response to that the target signal is in an enabled state, output a target bias voltage to increase a threshold voltage of the target transistor, wherein the enabled state of the target signal represents that the first logic gate circuit is in the first speed mode; and, wherein the target transistor comprises at least one of a P-type metal oxide semiconductor (PMOS) transistor or an N-type metal oxide semiconductor (NMOS) transistor;

the bias switching circuit comprises a first switching circuit and a second switching circuit, wherein the first switching circuit is configured to: receive a first bias signal; output a first target bias voltage corresponding to a first-type transistor in response to that the first bias signal is in the enabled state; and output a first initial bias voltage corresponding to the first-type transistor in response to that the first bias signal is in a disabled state; and the second switching circuit is configured to: receive a second bias signal; output a second target bias voltage corresponding to a second-type transistor in response to that the second bias signal is in the enabled state; and output a second initial bias voltage corresponding to the second-type transistor in response to that the second bias signal is in the disabled state; and the first switching circuit comprises a first NOT gate, a first transistor, and a second transistor, wherein a drain of the first transistor is connected to the first target bias voltage, and a drain of the second transistor is connected to the first initial bias voltage; a gate of the first transistor is connected to an input terminal of the first NOT gate, and is configured to receive the first bias signal;

a gate of the second transistor is connected to an output terminal of the first NOT gate; and a source of the first transistor is connected to a source of the second transistor, and is configured to output the first target bias voltage in response to that the first bias signal is in the enabled state.

2. The control circuit according to claim 1, wherein the bias switching circuit is further configured to: in response to that the target signal is in a disabled state, output an initial bias voltage to decrease the threshold voltage of the target transistor, wherein the disabled state of the target signal represents that the first logic gate circuit is in the second speed mode.

3. The control circuit according to claim 1, wherein the first-type transistor is a PMOS transistor, the second-type transistor is an NMOS transistor, the first target bias voltage corresponding to the first-type transistor is greater than the first initial bias voltage, and the second target bias voltage corresponding to the second-type transistor is lower than the second initial bias voltage; or the first-type transistor is an NMOS transistor, the second-type transistor is a PMOS transistor, the first target bias voltage corresponding to the first-type transistor is lower than the first initial bias voltage, and the second target bias voltage corresponding to the second-type transistor is higher than the second initial bias voltage.

4. The control circuit according to claim 1, wherein the first switching circuit further comprises a first selection circuit, the first selection circuit comprises a plurality of ports each corresponding to a respective different first candidate bias voltage;

the first selection circuit is configured to: receive a first selection signal, determine a target port according to the first selection signal, and determine a first candidate bias voltage corresponding to the target port as the first target bias voltage.

5. The control circuit according to claim 4, wherein the second switching circuit comprises a second NOT gate, a third transistor, and a fourth transistor;

a source of the third transistor is connected to the second target bias voltage, and a source of the fourth transistor is connected to the second initial bias voltage; a gate of the third transistor is connected to an input terminal of the second NOT gate, and is configured to receive the second bias signal; a gate of the fourth transistor is connected to an output terminal of the second NOT gate; and a drain of the third transistor is connected to a drain of the fourth transistor, and is configured to output the second target bias voltage in response to that the second bias signal is in the enabled state.

6. The control circuit according to claim 5, wherein the second switching circuit further comprises a second selection circuit, and the second selection circuit comprises a plurality of ports each corresponding to a respective different second candidate bias voltage; and the second selection circuit is configured to: receive a second selection signal, determine a target port according to the second selection signal, and determine a second candidate bias voltage corresponding to the target port as the second target bias voltage.

7. The control circuit according to claim 6, wherein the first-type transistor is a PMOS transistor, the second-type transistor is an NMOS transistor, the first candidate bias voltage corresponding to each port of the first selection circuit is greater than the first initial bias voltage, and the second candidate bias voltage corresponding to each port of the second selection circuit is lower than the second initial bias voltage; or the first-type transistor is an NMOS transistor, the second-type transistor is a PMOS transistor, the first candidate bias voltage corresponding to each port of the first selection circuit is lower than the first initial bias voltage, and the second candidate bias voltage corresponding to each port of the second selection circuit is higher than the second initial bias voltage.

8. The control circuit according to claim 1, comprising a plurality of first-type transistors and a plurality of second-type transistors, wherein the bias switching circuit comprises a plurality of first switching circuits and a plurality of second switching circuits; and the bias switching circuit is further configured to: supply a first output bias voltage to the plurality of first-type transistors through the plurality of first switching circuits respectively, and supply a second output bias voltage to the plurality of second-type transistors through the plurality of second switching circuits respectively.

9. The control circuit according to claim 1, further comprising a controller, configured to:

control the target signal to be in the enabled state in response to that the first logic gate circuit is in the first speed mode and a leakage current of the target transistor is greater than or equal to a preset value; and control the target signal to be in a disabled state in response to that the first logic gate circuit is in the second speed mode or in response to that the first logic gate circuit is in the first speed mode and the leakage current of the target transistor is less than the preset value.

10. The control circuit according to claim 1, further comprising a switch module and a second logic gate circuit, wherein:

the switch module is configured to: control a selector switch inside the switch module to be gated to the first logic gate circuit in response to that a transmission speed meets the first speed mode or the second speed mode; or control the selector switch inside the switch module to be gated to the second logic gate circuit in response to that the transmission speed meets a third speed mode; and the second logic gate circuit comprises at least one target transistor, a substrate of one of the at least one target transistor of the second logic gate is connected to the output terminal of the bias switching circuit, and is configured to receive an initial bias voltage outputted by the bias switching circuit, to reduce the threshold voltage of the target transistor of the second logic gate, wherein the second logic gate circuit has the third speed mode, and the transmission speed corresponding to the second speed mode is less than a transmission speed corresponding to the third speed mode.

11. A semiconductor memory, comprising a control circuit comprising: a bias switching circuit and a first logic gate circuit, wherein the first logic gate circuit comprises at least one target transistor, a substrate of one of the at least one target transistor is connected to an output terminal of the bias switching circuit, the first logic gate circuit has a first speed mode and a second speed mode, and a transmission speed of the first speed mode is lower than a transmission speed of the second speed mode; and the bias switching circuit is configured to: receive a target signal, and in response to that the target signal is in an enabled state, output a target bias voltage to increase a threshold voltage of the target transistor, wherein the enabled state of the target signal represents that the first logic gate circuit is in the first speed mode; and, wherein the target transistor comprises at least one of a P-type metal oxide semiconductor (PMOS) transistor or an N-type metal oxide semiconductor (NMOS) transistor;

the bias switching circuit comprises a first switching circuit and a second switching circuit, wherein the first switching circuit is configured to: receive a first bias signal; output a first target bias voltage corresponding to a first-type transistor in response to that the first bias signal is in the enabled state; and output a first initial bias voltage corresponding to the first-type transistor in response to that the first bias signal is in a disabled state; and the second switching circuit is configured to: receive a second bias signal; output a second target bias voltage corresponding to a second-type transistor in response to that the second bias signal is in the enabled state; and output a second initial bias voltage corresponding to the second-type transistor in response to that the second bias signal is in the disabled state; and the first switching circuit comprises a first NOT gate, a first transistor, and a second transistor, wherein a drain of the first transistor is connected to the first target bias voltage, and a drain of the second transistor is connected to the first initial bias voltage; a gate of the first transistor is connected to an input terminal of the first NOT gate, and is configured to receive the first bias signal;

a gate of the second transistor is connected to an output terminal of the first NOT gate; and a source of the first transistor is connected to a source of the second transistor, and is configured to output the first target bias voltage in response to that the first bias signal is in the enabled state.

12. The semiconductor memory according to claim 11, wherein the bias switching circuit is further configured to: in response to that the target signal is in a disabled state, output an initial bias voltage to decrease the threshold voltage of the target transistor, wherein the disabled state of the target signal represents that the first logic gate circuit is in the second speed mode.

13. The semiconductor memory according to claim 11, wherein the first-type transistor is a PMOS transistor, the second-type transistor is an NMOS transistor, the first target bias voltage corresponding to the first-type transistor is greater than the first initial bias voltage, and the second target bias voltage corresponding to the second-type transistor is lower than the second initial bias voltage; or the first-type transistor is an NMOS transistor, the second-type transistor is a PMOS transistor, the first target bias voltage corresponding to the first-type transistor is lower than the first initial bias voltage, and the second target bias voltage corresponding to the second-type transistor is higher than the second initial bias voltage.

14. The semiconductor memory according to claim 11, comprising a plurality of first-type transistors and a plurality of second-type transistors, wherein the bias switching circuit comprises a plurality of first switching circuits and a plurality of second switching circuits; and the bias switching circuit is further configured to: supply a first output bias voltage to the plurality of first-type transistors through the plurality of first switching circuits respectively, and supply a second output bias voltage to the plurality of second-type transistors through the plurality of second switching circuits respectively.

15. The control circuit according to claim 11, wherein the first switching circuit further comprises a first selection circuit, the first selection circuit comprises a plurality of ports each corresponding to a respective different first candidate bias voltage;

the first selection circuit is configured to: receive a first selection signal, determine a target port according to the first selection signal, and determine a first candidate bias voltage corresponding to the target port as the first target bias voltage.

16. The control circuit according to claim 15, wherein the second switching circuit comprises a second NOT gate, a third transistor, and a fourth transistor;

a source of the third transistor is connected to the second target bias voltage, and a source of the fourth transistor is connected to the second initial bias voltage; a gate of the third transistor is connected to an input terminal of the second NOT gate, and is configured to receive the second bias signal; a gate of the fourth transistor is connected to an output terminal of the second NOT gate; and a drain of the third transistor is connected to a drain of the fourth transistor, and is configured to output the second target bias voltage in response to that the second bias signal is in the enabled state.

17. The control circuit according to claim 16, wherein the second switching circuit further comprises a second selection circuit, and the second selection circuit comprises a plurality of ports each corresponding to a respective different second candidate bias voltage; and the second selection circuit is configured to: receive a second selection signal, determine a target port according to the second selection signal, and determine a second candidate bias voltage corresponding to the target port as the second target bias voltage.

18. The control circuit according to claim 17, wherein the first-type transistor is a PMOS transistor, the second-type transistor is an NMOS transistor, the first candidate bias voltage corresponding to each port of the first selection circuit is greater than the first initial bias voltage, and the second candidate bias voltage corresponding to each port of the second selection circuit is lower than the second initial bias voltage; or the first-type transistor is an NMOS transistor, the second-type transistor is a PMOS transistor, the first candidate bias voltage corresponding to each port of the first selection circuit is lower than the first initial bias voltage, and the second candidate bias voltage corresponding to each port of the second selection circuit is higher than the second initial bias voltage.

* * * * *